United States Patent
Wang (10) Patent No.: US 10,431,144 B2
(45) Date of Patent: Oct. 1, 2019

(54) SCAN CIRCUIT UNIT, DRIVING METHOD THEREOF, GATE DRIVE CIRCUIT, AND DISPLAY APPARATUS

(71) Applicant: BOE TECHNOLOGY GROUP CO., LTD., Beijing (CN)

(72) Inventor: Lirong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/811,912

(22) Filed: Nov. 14, 2017

(65) Prior Publication Data

US 2018/0301081 A1    Oct. 18, 2018

(30) Foreign Application Priority Data

Apr. 18, 2017    (CN) .......................... 2017 1 0254122

(51) Int. Cl.
| | | |
|---|---|---|
| *G11C 19/28* | (2006.01) | |
| *G09G 3/3266* | (2016.01) | |

(Continued)

(52) U.S. Cl.
CPC .......... *G09G 3/2092* (2013.01); *G09G 3/3266* (2013.01); *G09G 3/3677* (2013.01); *G11C 19/28* (2013.01); *G09G 2300/0426* (2013.01); *G09G 2300/0814* (2013.01); *G09G 2310/0286* (2013.01); *G09G 2310/0291* (2013.01); *G09G 2310/08* (2013.01)

(58) Field of Classification Search
CPC .. G09G 3/2092; G09G 3/3266; G09G 3/3677; G09G 2310/0291; G09G 2310/0286; G09G 2310/08; G09G 2300/0814; G09G 2300/0426; G11C 19/28

See application file for complete search history.

(56) References Cited

U.S. PATENT DOCUMENTS

| | | |
|---|---|---|
| 2005/0156859 A1 | 7/2005 | Jang et al. |
| 2006/0071923 A1 | 4/2006 | Lee et al. |

(Continued)

FOREIGN PATENT DOCUMENTS

| | | |
|---|---|---|
| CN | 1637796 A | 7/2005 |
| CN | 1755765 A | 4/2006 |

(Continued)

OTHER PUBLICATIONS

First Office Action for Chinese Patent Application No. 201710254122.7 dated Dec. 3, 2018.

*Primary Examiner* — Brent D Castiaux
(74) *Attorney, Agent, or Firm* — Calfee, Halter & Griswold LLP (57) ABSTRACT

A scan circuit unit includes a shift register unit; a first set of transistors operable to selectively transfer a first clock signal to a first output terminal in dependence on an output pulse signal of the shift register unit, and to selectively transfer an inactive level voltage to the first output terminal in dependence on a second clock signal; and a second set of transistors operable to selectively transfer the second clock signal to a second output terminal in dependence on the output pulse signal, and to selectively transfer the inactive level voltage to the second output terminal in dependence on the first clock signal.

14 Claims, 5 Drawing Sheets

(51) Int. Cl.
*G09G 3/20* (2006.01)
*G09G 3/36* (2006.01)

(56) References Cited

U.S. PATENT DOCUMENTS

| | | | | |
|---|---|---|---|---|
| 2013/0328612 A1* | 12/2013 | Ofuji | ............... | H03K 17/005 327/408 |
| 2015/0015562 A1* | 1/2015 | Han | ............... | G09G 3/3266 345/212 |
| 2016/0148556 A1* | 5/2016 | Tseng | ............... | G09G 3/3677 345/55 |

FOREIGN PATENT DOCUMENTS

| | | | |
|---|---|---|---|
| CN | 100385478 | C | 4/2008 |
| CN | 1677575 | B | 5/2011 |
| KR | 20060078570 | A | 7/2006 |

\* cited by examiner

SCAN CIRCUIT UNIT, DRIVING METHOD THEREOF, GATE DRIVE CIRCUIT, AND DISPLAY APPARATUS

CROSS REFERENCE TO RELATED APPLICATIONS

This application claims the benefit of Chinese Patent Application No. 201710254122.7 filed on Apr. 18, 2017, the entire disclosure of which is incorporated herein by reference.

TECHNICAL FIELD

The present disclosure relates to the field of display technology, and particularly to a scan circuit unit, a gate drive circuit, a display apparatus, and a method of driving the scan circuit unit.

BACKGROUND

In a display apparatus such as a thin film transistor liquid crystal display (TFT-LCD) or an active matrix organic light emitting diode (AMOLED) display, a plurality of rows of scan lines and a plurality of rows of data lines intersect each other to form a matrix, with the scan lines being sequentially supplied by a gate driver with a scan signal and the data line being synchronously supplied by a data driver with respective data voltages.

Typically, the gate driver is implemented with a plurality of cascaded shift register units. An increase in the size of the display panel and the pixel resolution requires more shift register units in the gate driver to supply scan signals to more scan lines, making it challenging to design a gate drive circuit with a more compact structure (potentially smaller footprint) and smaller power consumption.

SUMMARY

It would be advantageous to provide a mechanism that may alleviate, mitigate or eliminate at least one of the above problems.

According to an aspect of the present disclosure, a scan circuit unit is provided which comprises: a first clock terminal operable to receive a first clock signal; a second clock terminal operable to receive a second clock signal; a reference voltage terminal operable to receive an inactive level voltage; a first output terminal operable to output a first scan signal; a second output terminal operable to output a second scan signal; a shift register unit operable to generate an output pulse signal from an input pulse signal, the output pulse signal being a time-shifted version of the input pulse signal; a first set of transistors operable to selectively transfer the first clock signal from the first clock terminal to the first output terminal as the first scan signal in dependence on the output pulse signal, and to selectively transfer the inactive level voltage from the reference voltage terminal to the first output terminal as the first scan signal in dependence on the second clock signal from the second clock terminal; and a second set of transistors operable to selectively transfer the second clock signal from the second clock terminal to the second output terminal as the second scan signal in dependence on the output pulse signal, and to selectively transfer the inactive level voltage from the reference voltage terminal to the second output terminal as the second scan signal in dependence on the first clock signal from the first clock terminal.

In certain exemplary embodiments, the first set of transistors comprises: a first transistor having a gate operable to receive the output pulse signal from the shift register unit, a first electrode connected to the first clock terminal, and a second electrode connected to the first output terminal; and a second transistor having a gate connected to the second clock terminal, a first electrode connected to the reference voltage terminal, and a second electrode connected to the first output terminal.

In certain exemplary embodiments, the second set of transistors comprises: a third transistor having a gate connected to the first clock terminal, a first electrode connected to the reference voltage terminal, and a second electrode connected to the second output terminal; and a fourth transistor having a gate operable to receive the output pulse signal from the shift register unit, a first electrode connected to the second clock terminal, and a second electrode connected to the second output terminal electrode.

In certain exemplary embodiments, the first clock signal and the second clock signal have opposite phases and a period equal to a pulse width of the output pulse signal.

In certain exemplary embodiments, the transistors are N-type transistors.

In certain exemplary embodiments, the transistors are P-type transistors.

According to another aspect of the present disclosure, a gate drive circuit is provided which comprises: a plurality of scan circuit units each comprising: a first clock terminal operable to receive a first clock signal; a second clock terminal operable to receive a second clock signal; a reference voltage terminal operable to receive an inactive level voltage; a first output terminal operable to output a first scan signal; a second output terminal operable to output a second scan signal; a shift register unit operable to generate an output pulse signal from an input pulse signal, the output pulse signal being a time-shifted version of the input pulse signal; a first set of transistors operable to selectively transfer the first clock signal from the first clock terminal to the first output terminal as the first scan signal in dependence on the output pulse signal, and to selectively transfer the inactive level voltage from the reference voltage terminal to the first output terminal as the first scan signal in dependence on the second clock signal from the second clock terminal; and a second set of transistors operable to selectively transfer the second clock signal from the second clock terminal to the second output terminal as the second scan signal in dependence on the output pulse signal, and to selectively transfer the inactive level voltage from the reference voltage terminal to the second output terminal as the second scan signal in dependence on the first clock signal from the first clock terminal. The shift register units in the plurality of scan circuit units are cascaded such that the output pulse signal generated by an n-th one of the shift register units is supplied to an (n+1)-th one of the shift register units as the input pulse signal for the (n+1)-th shift register unit, n being a natural number.

According to yet another aspect of the present disclosure, a display apparatus is provided which comprises: a display panel comprising a pixel array having a plurality of pixels arranged in rows and columns; and a gate drive circuit comprising: a plurality of scan circuit units each comprising: a first clock terminal operable to receive a first clock signal; a second clock terminal operable to receive a second clock signal; a reference voltage terminal operable to receive an inactive level voltage; a first output terminal operable to output a first scan signal; a second output terminal operable to output a second scan signal; a shift register unit operable to generate an output pulse signal from an input pulse signal, the output pulse signal being a time-shifted version of the input pulse signal; a first set of transistors operable to selectively transfer the first clock signal from the first clock terminal to the first output terminal as the first scan signal in dependence on the output pulse signal, and to selectively transfer the inactive level voltage from the reference voltage terminal to the first output terminal as the first scan signal in dependence on the second clock signal from the second clock terminal; and a second set of transistors operable to selectively transfer the second clock signal from the second clock terminal to the second output terminal as the second scan signal in dependence on the output pulse signal, and to selectively transfer the inactive level voltage from the reference voltage terminal to the second output terminal as the second scan signal in dependence on the first clock signal from the first clock terminal. The shift register units in the plurality of scan circuit units are cascaded such that the output pulse signal generated by an n-th one of the shift register units is supplied to an (n+1)-th one of the shift register units as the input pulse signal for the (n+1)-th shift register unit, n being a natural number. Each of the plurality of scan circuit units is configured to supply the first and second scan signals to respective two rows of pixels in the pixel array, respectively.

According to still yet another aspect of the present disclosure, a method of driving the scan circuit unit as described above is provided. The method comprises: generating, by the shift register unit, the output pulse signal from the input pulse signal; selectively transferring, by the first set of transistors, the first clock signal from the first clock terminal to the first output terminal in dependence on the output pulse signal; selectively transferring, by the first set of transistors, the inactive level voltage from the reference voltage terminal to the first output terminal in dependence on the second clock signal from the second clock terminal; selectively transferring, by the second set of transistors, the second clock signal from the second clock terminal to the second output terminal in dependence on the output pulse signal; and selectively transferring, by the second set of transistors, the inactive level voltage from the reference voltage terminal to the second output terminal in dependence on the first clock signal from the first clock terminal.

These and other aspects of the present disclosure will be apparent from and elucidated with reference to the embodiment(s) described hereinafter.

BRIEF DESCRIPTION OF THE DRAWINGS

Further details, features and advantages of the disclosure are disclosed in the following description of exemplary embodiments in connection with the accompanying drawings, in which.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described below in detail with reference to the accompanying drawings.

Figure 1:
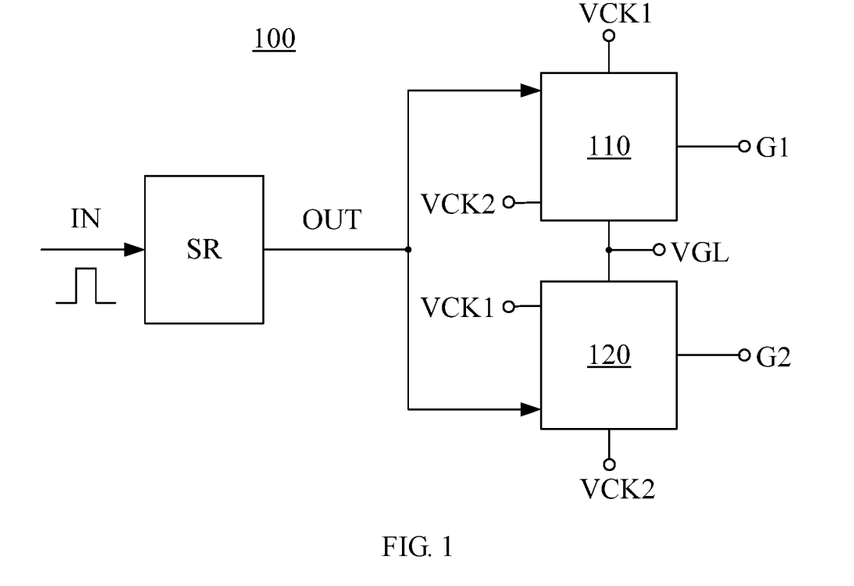
FIG. 1 schematically shows a block diagram of a scan circuit unit according to an embodiment of the present disclosure.

FIG. 1 schematically shows a block diagram of a scan circuit unit 100 according to an embodiment of the present disclosure. Referring to FIG. 1, the scan circuit unit 100 includes a shift register unit SR, a first set of transistors 110, and a second set of transistors 120.

The shift register unit SR is operable to generate an output pulse signal OUT from an input pulse signal IN, which output pulse signal OUT is a time-shifted version of the input pulse signal IN. In the present embodiment, the shift register unit SR may be any known or future shift register unit.

The first set of transistors 110 is operable to selectively transfer a first clock signal from a first clock terminal VCK1 to a first output terminal G1 as a first scan signal in dependence on the output pulse signal OUT, and to selectively transfer an inactive level voltage from a reference voltage terminal VGL to the first output terminal G1 as the first scan signal in dependence on a second clock signal from a second Clock terminal VCK2.

The second set of transistors 120 is operable to selectively transfer the second clock signal from the second clock terminal VCK2 to a second output terminal G2 as a second scan signal in dependence on the output pulse signal OUT, and to selectively transfer the inactive level voltage from the reference voltage terminal VGL to the second output terminal G2 as the second scan in dependence on the first clock signal from the first clock terminal VCK1 signal.

As used herein, the term "active level" refers to a level of a voltage signal at which the voltage signal enables the circuit element (e.g., a transistor) involved. In contrast, the term "inactive level" refers to a level of a voltage signal at which the voltage signal disables the circuit element involved. For N-type transistors, the active level is a high level and the inactive level is a low level. For P-type transistors, the active level is a low level and the inactive level is a high level.

The scan circuit unit 100 is able to output two scan signals G1 and G2 by means of one shift register unit SR and two sets of transistors 110, 120. In spite of the added two sets of transistors, this may be advantageous in that the shift register units required in the gate driver can be reduced as compared to the prior art in which a single shift register unit can only output one scan signal. This may lead to a reduced footprint of the gate driver and reduced power consumption.

Figure 2:
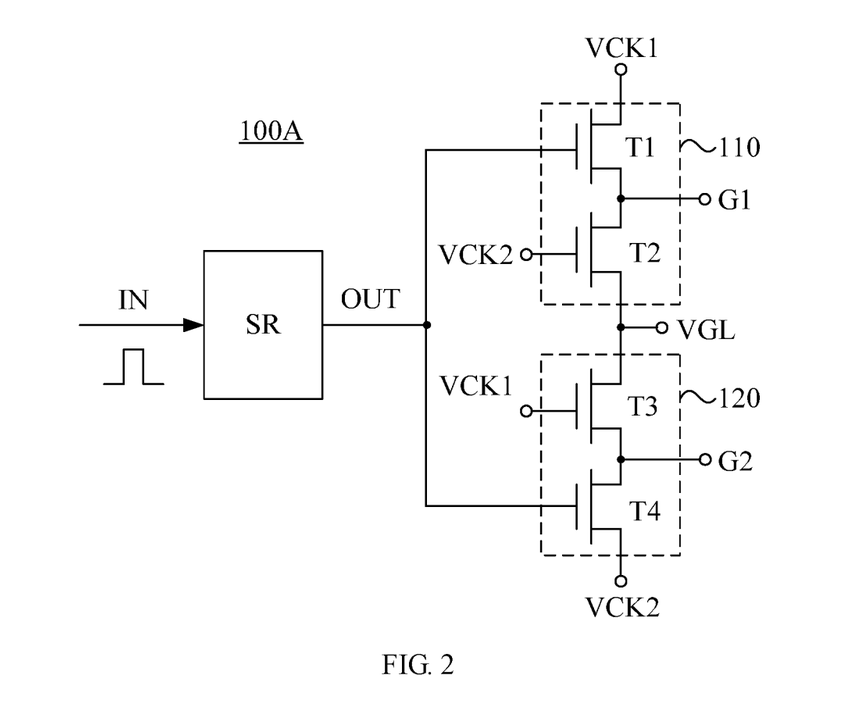
FIG. 2 schematically shows a circuit diagram of an example circuit of the scan circuit unit of FIG. 1.

FIG. 2 schematically shows a circuit diagram of an example circuit 100A of the scan circuit unit of FIG. 1. Referring to FIG. 2, the first set of transistors 110 includes a first transistor T1 and a second transistor T2, and the second set of transistors 120 includes a third transistor T3 and a fourth transistor T4.

The first transistor T1 has a gate operable to receive the output pulse signal OUT from the shift register unit SR, a first electrode connected to the first clock terminal VCK1, and a second electrode connected to the first output terminal G1. The second transistor T2 has a gate connected to the second clock terminal VCK2, a first electrode connected to the reference voltage terminal VGL, and a second electrode connected to the first output terminal G1. The third transistor T3 has a gate connected to the first clock terminal VCK1, a first electrode connected to the reference voltage terminal VGL, and a second electrode connected to the second output terminal G2. The fourth transistor T4 has a gate operable to receive the output pulse signal OUT from the shift register unit SR, a first electrode connected to the second clock terminal VCK2, and a second electrode connected to the second output terminal G2.

Figure 3:
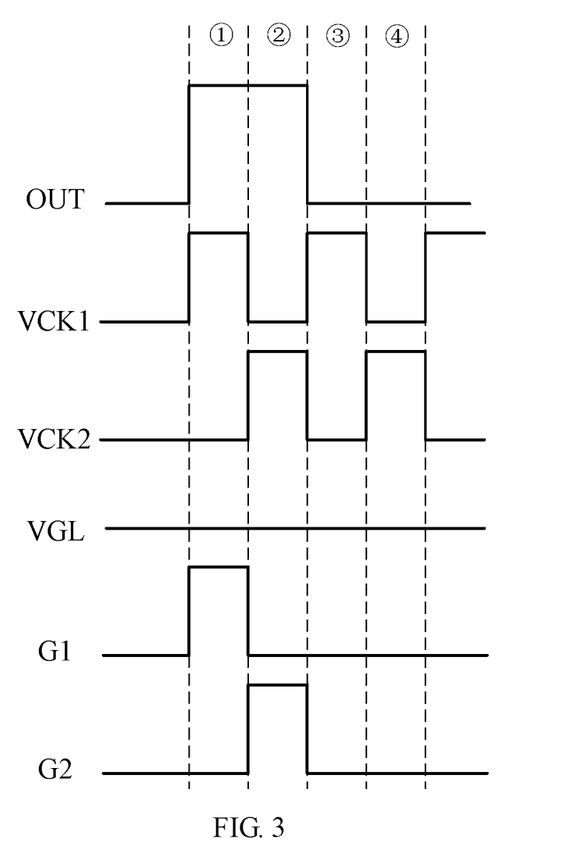
FIG. 3 schematically shows a timing diagram for the example scan circuit unit of FIG. 2.

FIG. 3 schematically shows a timing diagram for the example scan circuit unit 100A of FIG. 2. The operations of the scan circuit unit 100A will be described below with reference to FIGS. 2 and 3.

The shift register unit SR generates the output pulse signal OUT from the input pulse signal IN. In this example, the first clock signal received via the first clock terminal VCK1 and the second clock signal received via the second clock terminal VCK2 have opposite phases and a period equal to a pulse width of the output pulse signal OUT. In the following, a high level is indicated by "1" and a low level by "0".

In phase ①, OUT=1, VCK1=1, VCK2=0, VGL=0. The first transistor T1 is turned on, and the second transistor T2 is turned off. The first clock signal at the high level is transferred from the first clock terminal VCK1 to the first output terminal G1 through the first transistor T1. Thus, the first scan signal at the first output terminal G1 is at a high level in this phase. The third transistor T3 and the fourth transistor T4 are turned on. The second clock signal at the low level is transferred from the second clock terminal VCK2 to the second output terminal G2 through the fourth transistor T4 and the reference voltage at the low level is transferred from the reference voltage terminal VGL to the second output terminal G2. Thus, the second scan signal at the second output terminal G2 is at a low level in this phase.

In phase ②, OUT=1, VCK1=0, VCK2=1, VGL=0. The first transistor T1 and the second transistor T2 are turned on. The first clock signal at the low level is transferred from the first clock terminal VCK1 to the first output terminal G1 through the first transistor T1 and the reference voltage at the low level is transferred from the reference voltage terminal VGL to the first output terminal G1 through the second transistor T2. Thus, the first scan signal at the first output terminal G1 is at a low level in this phase. The fourth transistor T4 is turned on, and the third transistor T3 is turned off. The second clock signal at the high level is transferred from the second clock terminal VCK2 to the second output terminal G2 through the fourth transistor T4. Thus, the second scan signal at the second output terminal G2 is at a high level in this phase.

In phase ③, OUT=0, VCK1=1, VCK2=0, VGL=0. The first transistor T1 and the second transistor T2 are turned off. The first output terminal G1 is floated and the first scan signal at the first output terminal G1 is temporarily maintained at the low level. The third transistor T3 is turned on, and the fourth transistor T4 is turned off. The second clock signal at the low level is transferred from the second clock terminal VCK2 to the second output terminal G2 through the fourth transistor T4 so that the second scan signal at the second output terminal G2 is at the low level in this phase.

In phase ④, OUT=0, VCK1=0, VCK2=1, VGL=0. The first transistor T1 is turned off, and the second transistor T2 is turned on. The low reference voltage is transferred from the reference voltage terminal VGL to the first output terminal G1 through the second transistor T2 so that the first scan signal at the first output terminal G1 is at the low level in this phase. The third transistor T3 and the fourth transistor T4 are turned off. The second output terminal G2 is floated, and the second scan signal at the second output terminal G2 is temporarily maintained at the low level.

The operations in phases ② and ④ are repeated thereafter so that the first and second scan signals at the first and second output terminals G1, G2 are maintained at the low level.

Figure 4:
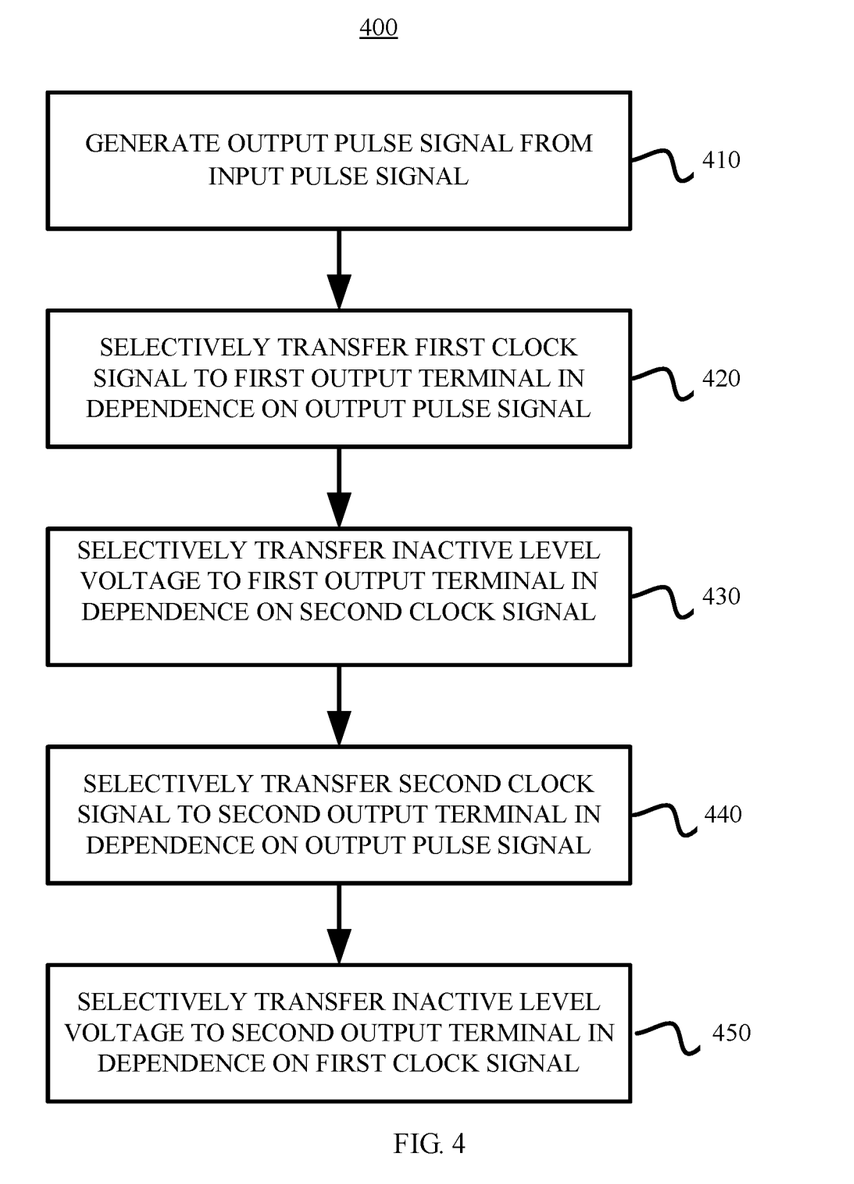
FIG. 4 shows a flow chart of a scan circuit unit driving method according to an embodiment of the present disclosure.

FIG. 4 shows a flow chart of a scan circuit unit driving method 400 according to an embodiment of the present disclosure. Referring to FIG. 4, the method 400 includes steps 410 to 450, which may be better understood by reference to the description above with respect to FIGS. 2 and 3.

Specifically, at step 410, the shift register unit SR generates the output pulse signal OUT from the input pulse signal IN. At step 420, the first set of transistors 110 selectively transfers the first clock signal from the first clock terminal VCK1 to the first output terminal G1 in dependence on the output pulse signal OUT. At step 430, the first set of transistors 110 selectively transfers the inactive level voltage from the reference voltage terminal VGL to the first output terminal G1 in dependence on the second clock signal from the second clock terminal VCK2. At step 440, the second set of transistors 120 selectively transfers the second clock signal from the second clock terminal VCK2 to the second output terminal G2 in dependence on the output pulse signal OUT. At step 450, the second set of transistors 120 selectively transfers the inactive level voltage from the reference voltage terminal VGL to the second output terminal G2 in dependence on the first clock signal from the first clock terminal VCK1.

While the various operations are depicted in the drawings in a particular order, this should not be construed as requiring that these operations be performed in the particular order shown or in a sequential order or that all of the illustrated operation be performed to obtain a desired result.

Figure 5:
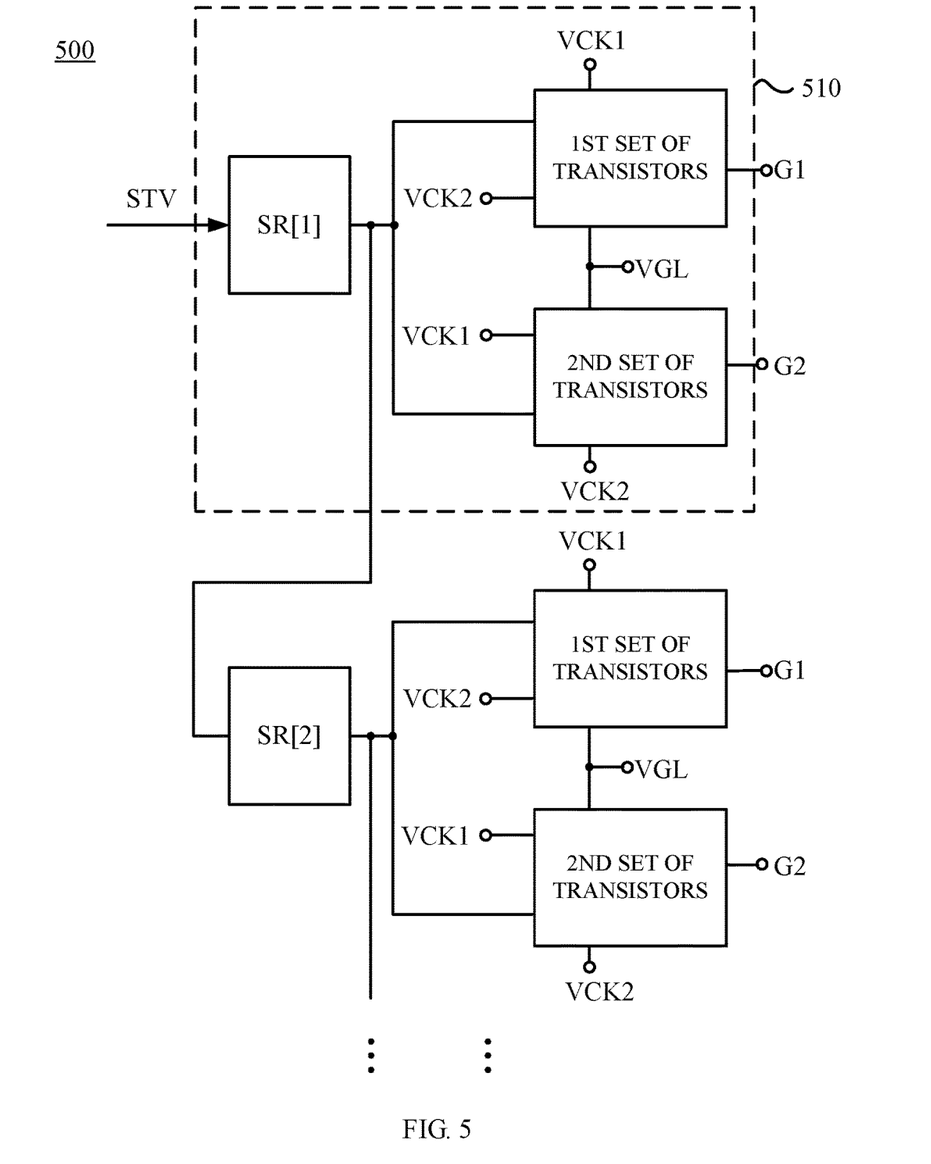
FIG. 5 schematically shows a schematic diagram of a gate drive circuit according to an embodiment of the present disclosure.

FIG. 5 schematically shows a schematic diagram of a gate drive circuit 500 according to an embodiment of the present disclosure. Referring to FIG. 5, the gate drive circuit 500 includes a plurality of cascaded scan circuit units 510, although only two of them are shown in the figure. The scan circuit unit 510 may be the scan circuit unit 100 as described above with respect to FIGS. 1-4, the detailed description of which is thus omitted here.

The shift register units SR in the plurality of scan circuit units 510 are cascaded. Specifically, the output pulse signal generated by the n-th shift register unit is supplied to the (n+1)-th shift register unit as an input pulse signal for the (n+1)-th shift register unit, where n is a natural number. In the example of FIG. 5, the output pulse signal generated by the shift register unit SR[1] is supplied to the next shift register unit SR[2] as an input pulse signal for the shift register unit SR[2], and so on. Thus, with the shift register unit SR[1] being supplied with a start signal STV, the plurality of scan circuit units 510 sequentially output, via respective first and second output terminals G1 and G2, scan signals that are time-shifted with respect to each other.

As will be described below, each of the scan circuit units 510 in the gate drive circuit 500 may be configured to supply scan signals to respective two rows of pixels in the pixel array of the display apparatus.

Figure 6:
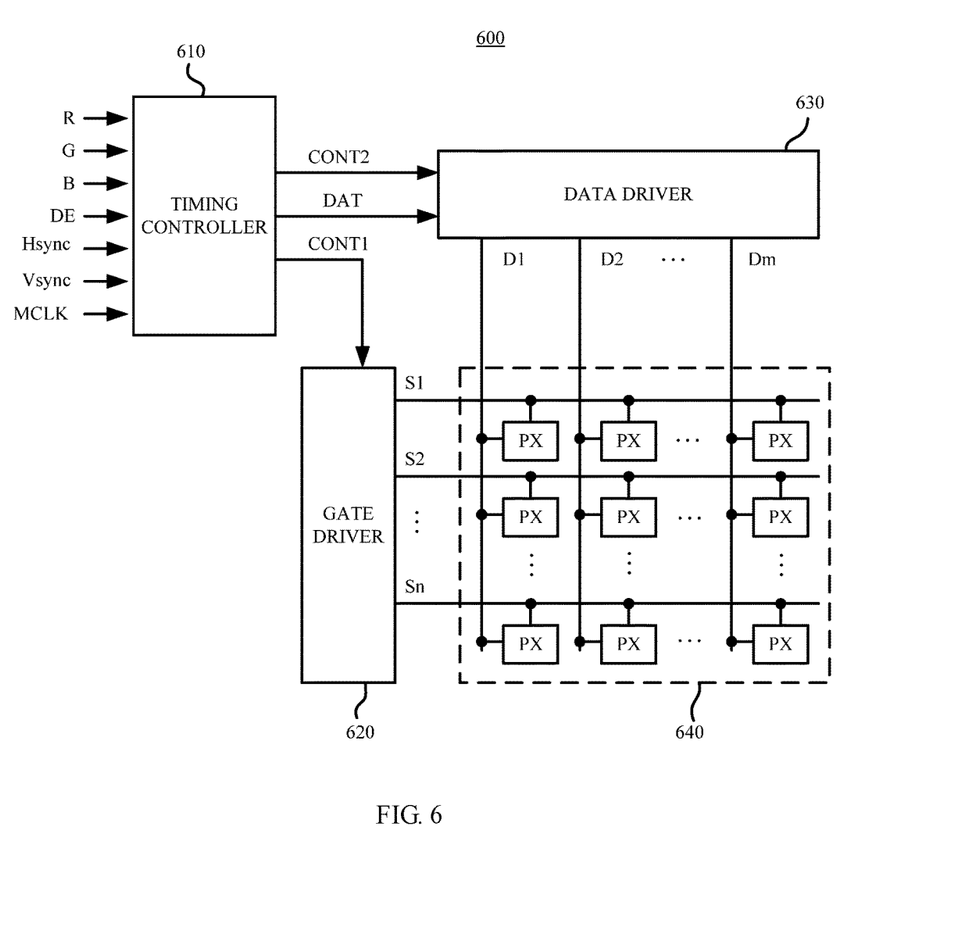
FIG. 6 schematically shows a block diagram of a display apparatus according to an embodiment of the present disclosure.

FIG. 6 schematically shows a block diagram of a display apparatus 600 according to an embodiment of the present disclosure. Referring to FIG. 6, the display apparatus 600 includes a timing controller 610, a gate driver 620, a data driver 630, and a display panel 640.

The timing controller 610 receives a synchronization signal and video signals R, G and B input from a system interface. The video signals R, G and B contain luminance information for each of the plurality of pixels. The synchronization signal includes a horizontal synchronizing signal Hsync, a vertical synchronizing signal Vsync, a main clock signal MCLK, and a data enable signal DE. The timing controller 610 generates a first drive control signal CONT1, a second drive control signal CONT2, and an image data signal DAT based on the video signals R, G and B, the horizontal synchronizing signal Hsync, the vertical synchronizing signal Vsync, the data enable signal DE, and the main clock signal MCLK. The timing controller 610 divides the video signals R, G and B into units of frames according to the vertical synchronizing signal Vsync and divides the video signals R, G and B into units of data lines according to the horizontal synchronizing signal Hsync to generate the image data signal DAT.

The display panel 640 includes a pixel array having pixels PX arranged substantially in matrix form. In the display panel 640, a plurality of substantially parallel scan lines S1 to Sn extend in a row direction, and a plurality of substantially parallel data lines D1 to Dm extend in a column direction. The scan lines S1 to Sn and the data lines D1 to Dm are coupled to the pixels PX. Each of the pixels PX may be a pixel element based on, for example, liquid crystal or an organic light emitting diode.

The gate driver 620 is coupled to the scan lines S1-Sn and generates a plurality of corresponding scan signals based on the first drive control signal CONT1. The first drive control signal CONT1 includes a frame start signal STV, a first clock signal SCLK1, and a second clock signal SCLK2. The frame start signal STV may be a signal that initiates generation of a scan signal for displaying a single frame image. The first clock signal SCLK1 and the second clock signal SCLK2 are synchronization signals for sequentially generating and applying the scan signal to the corresponding scan lines S1-Sn. The gate driver 620 may sequentially apply respective scan signals to the scan lines S1-Sn. The gate driver 620 may be implemented by the gate drive circuit 500 described above with respect to FIG. 5, in which case each of the scan driver circuit units 510 in the gate drive circuit 500 applies through its first and second output terminals G1, G2 the first and second scan signals to respective two of the scan lines S1-Sn.

The data driver 630 is coupled to the data lines D1-Dm and samples, holds and converts the image data signal DAT in dependence on the second drive control signal CONT2. The data driver 630 may program the data to the pixels PX by applying data voltages to the data lines D1 to Dm according to the scan signals respectively applied to the scan lines S1 to Sn.

In some exemplary embodiments, the gate driver 620 and/or the data driver 630 may be provided (e.g., integrated) in the display panel 640. Alternatively, the gate driver 620 and/or the data driver 630 may be connected to the display panel 640, for example, via a tape carrier package (TCP).

By way of example, and not limitation, the display apparatus 600 may be any product or component having a display function, such as a mobile phone, a tablet computer, a television set, a display, a notebook computer, a digital photo frame, a navigator, and the like.

It will be appreciated that in the above embodiments, although the transistors are illustrated and described as N-type transistors, P-type transistors are possible. In the case of a P-type transistor, the gate on voltage has a low level and the gate off voltage has a high level. In various embodiments, each of the transistors may be, for example, a thin film transistor, which is typically fabricated such that their first and second electrodes are used interchangeably. Other embodiments are also contemplated.

While the foregoing discussion contains a number of specific implementation details, these should not be construed as limiting the scope of any claimed invention and should be construed as a description of features that may be limited to a particular embodiment. Various modifications and variations of the foregoing illustrative embodiments of the present disclosure will become apparent to those skilled in the relevant art in view of the foregoing description taken in conjunction with the accompanying drawings. Any and all modifications will fall within the scope of the non-limiting and exemplary embodiments of the present disclosure. The scope of the present disclosure is only defined by the appended claims.

What is claimed is:

1. A scan circuit unit comprising:
   a first clock terminal operable to receive a first clock signal;
   a second clock terminal operable to receive a second clock signal;
   a reference voltage terminal operable to receive an inactive level voltage;

a first output terminal operable to output a first scan signal;

a second output terminal operable to output a second scan signal;

a shift register unit operable to generate an output pulse signal from an input pulse signal, the output pulse signal being a time-shifted version of the input pulse signal;

a first set of transistors operable to selectively transfer the first clock signal from the first clock terminal to the first output terminal as the first scan signal in dependence on the output pulse signal, and to selectively transfer the inactive level voltage from the reference voltage terminal to the first output terminal as the first scan signal in dependence on the second clock signal from the second clock terminal; and a second set of transistors operable to selectively transfer the second clock signal from the second clock terminal to the second output terminal as the second scan signal in dependence on the output pulse signal, and to selectively transfer the inactive level voltage from the reference voltage terminal to the second output terminal as the second scan signal in dependence on the first clock signal from the first clock terminal, wherein the first set of transistors comprises:

a first transistor having a gate directly connected to an output of the shift register unit to receive the output pulse signal, a first electrode connected to the first clock terminal, and a second electrode connected to the first output terminal; and a second transistor having a gate connected to the second clock terminal, a first electrode connected to the reference voltage terminal, and a second electrode connected to the first output terminal, and wherein the second set of transistors comprises:

a third transistor having a gate connected to the first clock terminal, a first electrode connected to the reference voltage terminal, and a second electrode connected to the second output terminal; and a fourth transistor having a gate directly connected to the output of the shift register unit to receive the output pulse signal, a first electrode connected to the second clock terminal, and a second electrode connected to the second output terminal electrode.

2. The scan circuit unit of claim 1, wherein the first clock signal and the second clock signal have opposite phases and a period equal to a pulse width of the output pulse signal.

3. The scan circuit unit of claim 1, wherein the transistors are N-type transistors.

4. The scan circuit unit of claim 1, wherein the transistors are P-type transistors.

5. A gate drive circuit comprising:
a plurality of scan circuit units each comprising:
a first clock terminal operable to receive a first clock signal;
a second clock terminal operable to receive a second clock signal;
a reference voltage terminal operable to receive an inactive level voltage;
a first output terminal operable to output a first scan signal;
a second output terminal operable to output a second scan signal;
a shift register unit operable to generate an output pulse signal from an input pulse signal, the output pulse signal being a time-shifted version of the input pulse signal;

a first set of transistors operable to selectively transfer the first clock signal from the first clock terminal to the first output terminal as the first scan signal in dependence on the output pulse signal, and to selectively transfer the inactive level voltage from the reference voltage terminal to the first output terminal as the first scan signal in dependence on the second clock signal from the second clock terminal, wherein the first set of transistors comprises: a first transistor having a gate directly connected to an output of the shift register unit to receive the output pulse signal, a first electrode connected to the first clock terminal, and a second electrode connected to the first output terminal; and a second transistor having a gate connected to the second clock terminal, a first electrode connected to the reference voltage terminal, and a second electrode connected to the first output terminal; and a second set of transistors operable to selectively transfer the second clock signal from the second clock terminal to the second output terminal as the second scan signal in dependence on the output pulse signal, and to selectively transfer the inactive level voltage from the reference voltage terminal to the second output terminal as the second scan signal in dependence on the first clock signal from the first clock terminal, wherein the second set of transistors comprises: a third transistor having a gate connected to the first clock terminal, a first electrode connected to the reference voltage terminal, and a second electrode connected to the second output terminal; and a fourth transistor having a gate directly connected to the output of the shift register unit to receive the output pulse signal, a first electrode connected to the second clock terminal, and a second electrode connected to the second output terminal electrode, wherein the shift register units in the plurality of scan circuit units are cascaded such that the output pulse signal generated by an n-th one of the shift register units is supplied to an (n+1)-th one of the shift register units as the input pulse signal for the (n+1)-th shift register unit, n being a natural number.

6. The gate drive circuit of claim 5, wherein the first clock signal and the second clock signal have opposite phases and a period equal to a pulse width of the output pulse signal.

7. The gate drive circuit of claim 5, wherein the transistors are N-type transistors.

8. The gate drive circuit of claim 5, wherein the transistors are P-type transistors.

9. A display apparatus comprising:
a display panel comprising a pixel array having a plurality of pixels arranged in rows and columns; and
a gate drive circuit comprising:
a plurality of scan circuit units each comprising:
a first clock terminal operable to receive a first clock signal;
a second clock terminal operable to receive a second clock signal;
a reference voltage terminal operable to receive an inactive level voltage;
a first output terminal operable to output a first scan signal;
a second output terminal operable to output a second scan signal;

a shift register unit operable to generate an output pulse signal from an input pulse signal, the output pulse signal being a time-shifted version of the input pulse signal;

a first set of transistors operable to selectively transfer the first clock signal from the first clock terminal to the first output terminal as the first scan signal in dependence on the output pulse signal, and to selectively transfer the inactive level voltage from the reference voltage terminal to the first output terminal as the first scan signal in dependence on the second clock signal from the second clock terminal, wherein the first set of transistors comprises: a first transistor having a gate directly connected to an output of the shift register unit to receive the output pulse signal, a first electrode connected to the first clock terminal, and a second electrode connected to the first output terminal; and a second transistor having a gate connected to the second clock terminal, a first electrode connected to the reference voltage terminal, and a second electrode connected to the first output terminal; and a second set of transistors operable to selectively transfer the second clock signal from the second clock terminal to the second output terminal as the second scan signal in dependence on the output pulse signal, and to selectively transfer the inactive level voltage from the reference voltage terminal to the second output terminal as the second scan signal in dependence on the first clock signal from the first clock terminal, wherein the second set of transistors comprises: a third transistor having a gate connected to the first clock terminal, a first electrode connected to the reference voltage terminal, and a second electrode connected to the second output terminal; and a fourth transistor having a gate directly connected to the output of the shift register unit to receive the output pulse signal, a first electrode connected to the second clock terminal, and a second electrode connected to the second output terminal electrode, wherein the shift register units in the plurality of scan circuit units are cascaded such that the output pulse signal generated by an n-th one of the shift register units is supplied to an (n+1)-th one of the shift register units as the input pulse signal for the (n+1)-th shift register unit, n being a natural number, and wherein each of the plurality of scan circuit units is configured to supply the first and second scan signals to respective two rows of pixels in the pixel array, respectively.

10. The display apparatus of claim 9, wherein the first clock signal and the second clock signal have opposite phases and a period equal to a pulse width of the output pulse signal.

11. The display apparatus of claim 9, wherein the transistors are N-type transistors.

12. The display apparatus of claim 9, wherein the transistors are P-type transistors.

13. A method of driving the scan circuit unit of claim 1, the method comprising:

generating, by the shift register unit, the output pulse signal from the input pulse signal;

selectively transferring, by the first set of transistors, the first clock signal from the first clock terminal to the first output terminal in dependence on the output pulse signal;

selectively transferring, by the first set of transistors, the inactive level voltage from the reference voltage terminal to the first output terminal in dependence on the second clock signal from the second clock terminal;

selectively transferring, by the second set of transistors, the second clock signal from the second clock terminal to the second output terminal in dependence on the output pulse signal; and selectively transferring, by the second set of transistors, the inactive level voltage from the reference voltage terminal to the second output terminal in dependence on the first clock signal from the first clock terminal.

14. The method of claim 13, wherein the first clock signal and the second clock signal have opposite phases and a period equal to a pulse width of the output pulse signal.

* * * * *